United States Patent [19]

Schmalz

[11] 4,216,492

[45] Aug. 5, 1980

[54] METHOD OF TREATING TELEVISION PICTURE SIGNALS AND WIDE-BAND DATA SIGNALS BY MODULATING THE COLOR CARRIER SIGNAL

[76] Inventor: Axel Schmalz, Südl. Auffahrtsallee 25, 8000 München 19, Fed. Rep. of Germany

[21] Appl. No.: 895,647

[22] Filed: Apr. 12, 1978

[30] Foreign Application Priority Data

Apr. 18, 1977 [DE] Fed. Rep. of Germany ....... 2717090

[51] Int. Cl.² .................... H04N 5/785; H04N 9/535
[52] U.S. Cl. .................................. 358/16; 358/142; 358/183; 360/18
[58] Field of Search ................... 358/4, 12, 16, 22, 21, 358/142, 183; 360/18, 19

[56] References Cited

U.S. PATENT DOCUMENTS

| | | | |
|---|---|---|---|
| 3,900,887 | 8/1975 | Soga et al. | 358/142 |
| 4,018,986 | 4/1977 | Wilk | 358/142 |
| 4,028,733 | 6/1977 | Ulicki | 358/142 |
| 4,045,815 | 8/1977 | Griffith et al. | 358/183 |

OTHER PUBLICATIONS

King, A Novel TV Add-On Data Communication System, 1/74, Journal of the SMPTE, vol. 83, pp. 10–13.

*Primary Examiner*—Stuart N. Hecker
*Attorney, Agent, or Firm*—Fitzpatrick, Cella, Harper & Scinto

[57] ABSTRACT

Wide band measured data signals are recorded synchronously with television signals by time and/or frequency multiplexing techniques. Measured data signals are scanned by a multiplexer, converted to digital form, and temporarily stored. Signals from the store together with auxiliary information signals are converted from parallel to serial form and suitably coded for multiplexing. For time multiplexing, the picture may be limited to square form to increase the bandwidth available for the serial information signals. With either form of multiplexing, helical scan magnetic tape recording is preferably employed. Playback circuits effect separation of picture from information signals through a discriminator for time multiplexed signals and through a filter for frequency multiplexed signals. Provision is made for insertion of special lines in the television picture and for the retrieval thereof on playback.

17 Claims, 6 Drawing Figures

METHOD OF TREATING TELEVISION PICTURE SIGNALS AND WIDE-BAND DATA SIGNALS BY MODULATING THE COLOR CARRIER SIGNAL

BACKGROUND OF THE INVENTION

There are a variety of applications in which simultaneous recording of video information and measured values permits the treatment of the measurements or the analysis of the measured results to be simplified. This proves to be so, for example, in the case of the behaviour of patients, and the performance of motor cars and the like in motion. In the great majority of cases the resolution and speed of the recording of video information, which can be achieved with the recording of television pictures on magnetic tape, is adequate. For the evaluation of experiments when such means is employed, a clear correlation of measuring data and video information is always necessary.

In known methods of synchronous recording of wide-band measuring data and television pictures, the measuring data and pictures are recorded separately. Correlation between the two media is then effected by auxiliary information for example by a recorded time code.

The practice is also known of recording very slowly produced measuring data or event marks on the medium of the pictures recording, for example, on sound tracks of films and video tapes. Information can then be imaged into films, and alphanumeric symbols can be mixed into a television picture. The band width that can be achieved in this way for the measuring data is however inadequate for recording rapidly produced measuring data.

OBJECTS OF THE INVENTION

It is an object of the invention to provide for the synchronous recording to television pictures with wideband data on a single recording medium.

It is a further object of the invention to provide for the synchronous recording of television picture signals with signals representing a high information content.

The invention also has as an object to provide apparatus to effect such synchronous recording and playback which employs substantially only standard equipment.

A further object of the invention is to provide a method of and apparatus for synchronous recording of wide band information signals and television pictures which makes efficient use of the recording medium.

Yet another object of the invention is to provide for the synchronous recording and playback of measurement information and associated television picture signals with high accuracy and wide dynamic range.

SUMMARY OF THE INVENTION

In accordance with the invention, these and other objects are obtained in that measured and/or other information signals to be recorded are continuously received, digitalized, temporarily stored, and mixed with a video signal by time and/or frequency multiplexing techniques prior to recording by video-recorder means.

Measured data are preferably digitalized together with auxiliary information for the video information of the video signal, and recorded in the part of the recording not occupied by the video information. The conversion of the measured values to digital form and their storage in this form affords high accuracy, wide dynamic range and good freedom from interference.

In accordance with the invention there can be made available, in addition to the recording of a television picture, a band width of 1 MHz for the recording of the measured data. This band width is comparable with the band width of instrumentation tape apparatus in the same price class, but the tape running times afforded by the invention amount to 30 to 60 minutes compared with, say, 6 to 12 minutes with such instrumentation tape apparatus.

Alternatively or additionally, measured data can be frequency multiplexed with the carrier frequency provided for the color signal, but playback of colored television pictures is not then possible.

Advantageously, the measured data and television pictures are recorded by the helical scan recording system or by the transversed track recording system on a video tape. Additional data may be recorded on narrow-band data channels, for example, in the sound track. In this way commentaries, test times and event marks may be recorded in addition.

The measurement data may be recorded by the frequency modulation method. In this way a better signal-to-noise ratio is obtained than with instrumentation tape apparatus and there is the possibility of recording direct voltage signals and thus the employment of ternary and quaternary codes.

The measuring data may also be recorded by the amplitude modulation method on the color carrier.

Furthermore, the television picture can be cut down, as to a square format. The average band width for the recording of the measuring data is thereby increased to about 2 MHz.

RECORDING

For the recording of measured data, various magnetic tape stores have been employed in the past. Analogue magnetic tape apparatus was employed initially for the storage of analogue measured values by the direct or frequency modulation method, the recording being then effected on a number of parallel tracks extending in the direction of feed of the tape. The magnetic tape then is made to run continuously past a group of heads so that a plurality of parallel tracks are recorded on the tape. Several signals can thereby be recorded independently of one another. For wide-band recording, tape speeds up to 120 inches per second (304.8 cm/sec.) are usual, which necessitates a high consumption of tape. In this direct method, band widths of maximum 2 MHz and in the FM method of maximum 400 KHz can be achieved (see DIN 66 210). Television pictures cannot be recorded since the band width is not adequate.

In some cases digitalized measured values are recorded too by the direct method or by saturation magnetization serially on analogue magnetic tape apparatus in the form of a PCM recording. This is merely a special case of an analogue recording.

Digital magnetic tape apparatus is also employed for the recording of data existing in binary form, recording being effected in rows transversely to the direction of feed of the tape. With such tape apparatus the magnetizable coating is driven into saturation so that only the states "0" and "1" are possible. Only digital data can thereby be recorded. Usually tape speeds are up to 125 inches per sec. (317.5 cm/sec.) and storage densities up to 1600 bytes per inch (63 bytes/mm). Special machines have tape speeds up to 250 inches per sec, and newly developed machines can record up to 6250 bytes per inch. With standard apparatus as 125 inches per sec. and 1600 bytes per inch, 150 000 bytes per sec, or 1.2 MBites per sec, can be recorded continuously. This corresponds approximately to the capacity of one track of an instrumentation apparatus. The running time of the tape (730 meter tape) in that case amounts to less than 4 minutes. Because of the limited band width no television pictures can be recorded.

With the development of television techniques the necessity arose for recording television signals. The band width of 4 to 6 MHz could not be recorded with existing magnetic tape apparatus.

The band width of the recording is a product of storage density and tape speed. The storage density is limited by the geometry of the magnetic heads—gap width—and by the material of the tape. Since the storage density essentially cannot be increased, the tape speed must be raised. An attempt was first made to develop tape apparatus with very high tape speeds—up to 800 inches per second. Because of the consequent difficulties, such as in tape-to-head contact, abrasion, and synchronizing, and the short running time of the tape, this method has not proved adequate.

Instead, the transverse track recording system and the helical scan recording system (cf. DIN 15900, Part 2) have been evolved for the recording of the television pictures. The necessary writing speed being obtained by rotating video heads. The video heads rotate transversely or obliquely to the direction of feed of the tape. The rate of feed of the tape can thereby be kept relatively low: 7.5 to 25 inches per sec. or 19.1 to 63.5 cm/sec. This concept has been realized in various ways in which essentially the angle between the plane of rotation of the heads and the direction of feed of the tape, the number of heads and the angle of wrap have been variously chosen. With these methods, besides the television picture contained in the oblique track, narrow-band additional information, such as sound, time code and control signals is recorded by conventional techniques in longitudinal tracks.

The high band-width of the helical scan recording system, together with the long running time of the tape, makes the method interesting for the recording of wide-band measuring signals too.

A considerable disadvantage of helical scan recording devices arises from the fact that the track, which runs at an angle to the tape, periodically leaves the tape at one edge and starts again at the other. Breaks thereby occur in the recording, the size of which breaks depends not only upon the geometry of the tape guide but also upon the state of the edges of the tape, which can be adversely affected by wear, ageing, and climatic effects.

In order to avoid this disadvantage, a number of video heads are employed in some methods, and these are electrically switched over before the active video head reaches the edge of the tape. The interference from the edges of the tape is thereby reduced, but additional sources of error arise in dependence on the adjustment of the video heads. For this reason helical scan recording has hitherto been able to become accepted only in special cases for the recording of wide-band measuring data, e.g., for storage of radar signals, X-ray pictures or blocked digital data for computer systems. In the case of television techniques, on the contrary, breaks of the kind in question are not disturbing if they are placed in the gaps between pictures or lines of a picture, in which the television screen is darkened in any event for the return of the beam to the start of the picture or the line. The method of recording in accordance with the invention is very well suited to the recording of measured values in combination with a recording of television pictures on magnetic tape in accordance with the helical scan recording system or transversal track recording system.

PLAYBACK

Playback of information which has been recorded by use of the helical scan recording system on magnetic tape in accordance with the invention can be effected with the rate of feed of the magnetic tape reduced and the speed of the video head carrier maintained. A slow-motion playback of the television picture or even a still picture, is thus obtained whilst the data contained in the oblique track on the tape together with the television picture is played back at the original speed. Because of the slow feed speed of the magnetic tape, the television picture and the measuring data are still read within a certain time. The measuring data recorded on an oblique track are temporarily stored after reading and can then be further processed at the processing speed of normal computers and read out slowly.

Thus data rapidly received may be played back very slowly, e.g., at 1 television picture per second. The measuring data picked up with each television picture may at playback be turned over to an ordinary computer, evaluated there, and the results made available, even during the display of the television picture.

A further feature of playback in accordance with the invention consists in displaying the measuring data in graphical form, as a bar charge, or in alphanumeric form, beside the television picture or combined with the television picture. This possibility is available because a television picture is provided which is synchronous with the measuring data. Little additional equipment for such display or mixing is required since the video signal must be prepared in the playback electronics anyway. For simple displays this treatment may be effected by standard or hardware circuits, but the use of a microprocessor allows greater flexibility in the type of display.

RECORDING CIRCUITS

A circuit arrangement for the recording of wide-band measured data and television pictures in accordance with the invention comprises a multiplexer for scanning the measured values, the output of which is connected via a holding circuit to an analogue-digital converter. A temporary store receives the measured data in parallel from the analogue-digital converter and feeds it to a parallel-serial converter connected to a mixer which additionally receives the video information. The output of the mixer is led to a video recorder.

Control of multiplexer, analogue-digital converter and the writing in of the data into the temporary store is effected continuously at a speed which corresponds with the average data rate. The reading out of the data from the temporary store is effected intermittently at a higher speed, namely the recording speed.

The temporary store is advantageously a first-in-first-out store. The multiplexer can be arranged to scan several measuring channels in optional sequence and at different frequencies.

Between the parallel-series converter and the mixer, there may be provided a code converter in which the data are coded into a code particularly suited for recording on the magnetic tape.

Another input to the parallel-serial converter is advantageously connected to an auxiliary information circuit. By this means auxiliary information such as forward run, synchronous words, picture or line number, control bits for the vertical and horizontal synchronization and the amplitude regulation of the television picture, parity bits, word address, characteristic number, time code, status information etc. can be inserted.

In the case of a circuit arrangement for frequency multiplexing recording, a modulator is provided between the parallel-serial converter and the mixer.

Finally a clock pulse or timing generator is advantageously provided and this is connected to the video camera and to the parallel-serial converter.

PLAYBACK CIRCUIT

A circuit arrangement for the playback of wide-band measuring data and television pictures which have been recorded in accordance with the invention can comprise a discriminator or a filter to which the video recorder is connected. One output from the filter or from the discriminator is led to a video monitor and the other output to a bit-synchronizer, the bit-synchronizer being connected via a data synchronization circuit and a serial-parallel converter to a temporary store. The temporary store is connected to a decoder and output unit. The circuit arrangement with the discriminator is provided for a playback of television picture and measuring data recorded by the time multiplexing method, the switching arrangement with the filter being provided for a recording made by the frequency multiplexing method.

The temporary store is advantageously a first-in-first-out store.

For playback of the time multiplexed signals, the discriminator is advantageously led to the video monitor via a mixer in which color carriers, auxiliary information and special line information are mixed in or special line information is fed to a special line decoder.

For playback by the frequency multiplexing method the filter may be connected to the video monitor via a special line decoder.

IN THE DRAWINGS

Figure 1:
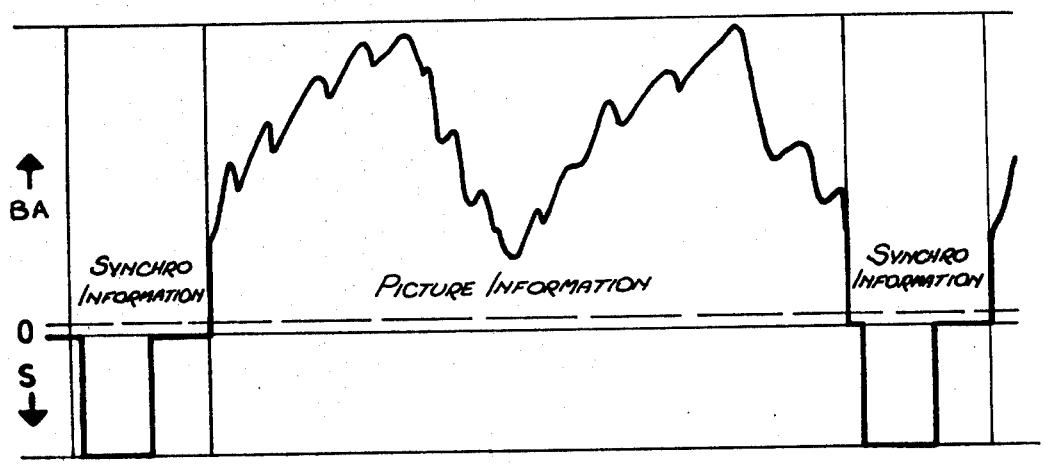
FIG. 1 represents a normal BAS-signal.

In FIG. 1 there is illustrated a normal BAS-signal for one line of a television picture. The picture information of this video signal occupies only one part of the width of the signal. In the breaks between successive picture information signals there is accommodated auxiliary information for picture synchronization and amplitude regulation.

In contrast with this, in accordance with the method of the invention, measurement data can be recorded by time multiplexing techniques at a high data rate in the part of the video signal not occupied by picture information.

In the case of the SW standards which apply in Germany, the time available for one line amounts altogether to 64 microseconds, of which information relating strictly to the picture takes up only 52 micro-seconds. The picture information therefore occupies only about 80% of the usable band width, so for the recording of measurement data there is available an average band width of about $0.2 \times 5$ MHz, that is, 1 MHz.

With this method for synchronous recording of measurement data and television pictures, the auxiliary information for picture synchronization and amplitude regulation in the breaks between the picture informations is blanked out, so as to be replaced by digital control commands. These control commands are then reinserted in the break as part of the measurement data to be recorded. The control commands based on the auxiliary information occupy only a small part of the data capacity available in the break, so that the remaining capacity is completely available for the measurement data which are to be recorded.

Figure 2:
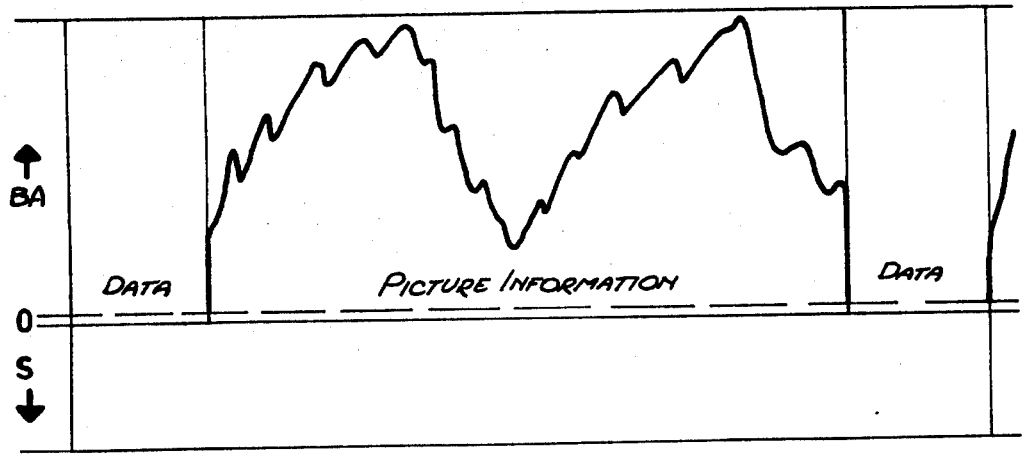
FIG. 2 represents a BAS-signal modified in accordance with the invention in that digital measurement data together with synchronous information are added by time multiplexing techniques externally of the picture-information.

In FIG. 2 a BAS-signal is illustrated, which is modified with respect to the normal BAS-signal illustrated in FIG. 1 in that the breaks between the picture information signals, in which the auxiliary information had previously been inserted, now contain data in digital form.

The band width available for the recording of measurement data can be still further increased if the proportion of the picture information is reduced in such a way that the television picture is trimmed off at one or both sides. If the television picture is thereby reduced to a square shape, the band width available for the recording of the measurement data is increased on the average to about 2 MHz.

An alternative or additional way of recording measurement data together with television pictures consists in recording the measurement data on an auxiliary carrier by the frequency multiplexing method.

With the development of color television, it became desirable not only to be able to receive transmissions broadcast in color, but also in black-and-white on existing black-and-white sets. Consequently the color picture signal is divided into one signal for the luminance (the black-and-white picture) and one signal for the chrominance. The chrominance or color signal is transmitted frequency complexed with luminance signal. A carrier frequency was selected for the color signal which impaired the quality of the television picture only to an insigificant extent (e.g., 4.43361875 MHz in the case of PAL). If in the recording of a television picture the color information is omitted, this carrier can be used for the recording of other data.

With the time multiplexing method, data and lines of the picture are accepted alternately. With the frequency multiplexing method breaks in recording occur at the edge of the tape or through the switching over of the video heads. However with many measuring arrangements it is necessary to accept data continuously. With the method described herein the measured values are accepted continuously, digitalized, stored and recalled at increased speed for recording on a magnetic tape in the breaks in the picture information. To this end, a first-in-first-out store (bucket chain store) is advantageously employed.

Control signals for picture synchronization are also inserted into the recording. At playback the data are separated from the picture information, stored temporarily, and read out again at the original speed. At the same time the synchronous pulses and signals for amplitude regulation are recovered from the control signals and inserted into the breaks in the picture. The color carrier may then optionally be employed also for timing the data recording and regeneration.

If the possibility of recording color pictures is waived, data may be recorded exclusively or additionally on the color carrier. By means of the temporary storage mentioned above, the breaks at the tape edges or at the switching over video heads can be bridged over.

On playback of the recorded wide-band data, further digital processing is usually possible only with a time transformation, since the processing speed of many computers is not adequate. In the case of analogue magnetic tape apparatus the playback may be effected with reduced tape speed up to the factor 128. Digital tape apparatus delivers the data in blocks and may be stopped after each block.

Although in the case of simultaneous recording of television pictures and wide-band measuring data on a magnetic tape apparatus a speed transformation is necessary at playback of the measuring data, a reduction in the reading in speed is not, however, possible since the picture cannot then be played back.

At playback of the data recorded as described above, therefore, only the rate of feed of the tape is reduced, but not the speed of rotation of the video head. A slow-motion playback of the picture is obtained thereby, or a still picture. Because of the constant speed of the video head carried the data contained in an oblique track on the tape are played back, like the television picture, at the original speed. The slow-motion effect consists in the fact that because of the slow rate of feed of the tape the television picture and measuring data are read again and again during a certain length of time. All of the measuring data recorded on an oblique track must therefore be stored temporarily after reading and read out slowly. The demand on storage space can be reduced by division of the oblique tracks into suitable sections which are stored one after another.

Since the quality of the data is dependent upon the position of the video heads in relation to the oblique track, data checks are necessary in order to establish when a new track or a new section of track can be taken into the store. For this purpose check bits may be inserted for parity checking, or cyclical redundancy codes employed.

Thus the method of playback enables rapidly received data to be played back very slowly, e.g., 1 picture per second. The measuring data accepted with each television picture may at playback be transmitted to a computer, evaluated, and the results made available whilst pictures still being displayed.

For a first evaluation of measuring results it is frequently convenient to display the measured data graphically. As a synchronous television picture is available, the data may be combined with the picture or displayed beside it. Depending upon the application, the display may be effected in graphical form, as a bar chart or in alphanumeric form. The additional outlay is small, since the video signal must be prepared in the playback electronics in any event. For simple displays preparation can be effected in hardware circuits but the use of a microprocessor allows greater flexibility in the type of the displays.

Figure 3:
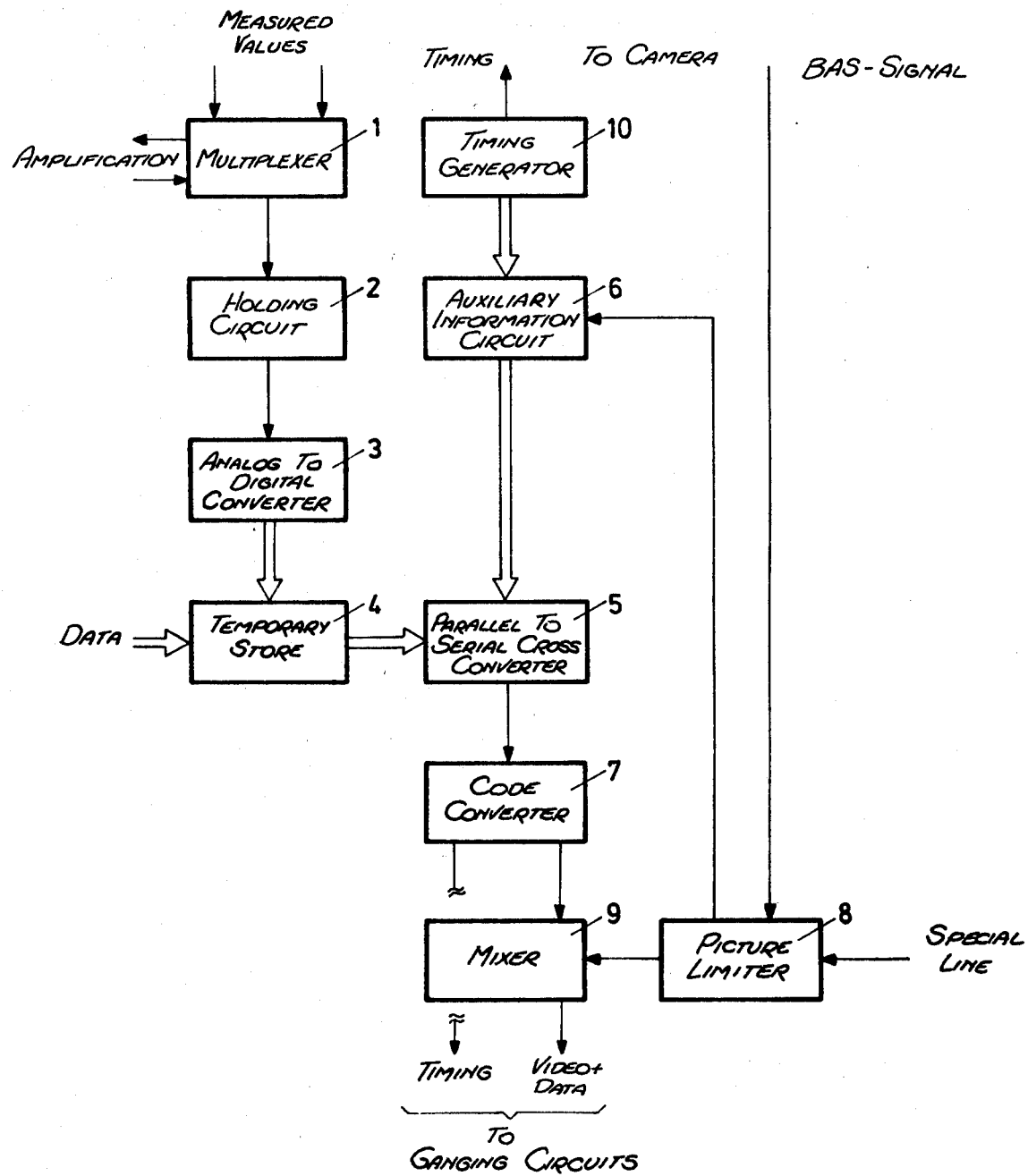
FIG. 3 is a block diagram of a circuit arrangement for recording by the time multiplexing method.
Figure 4:
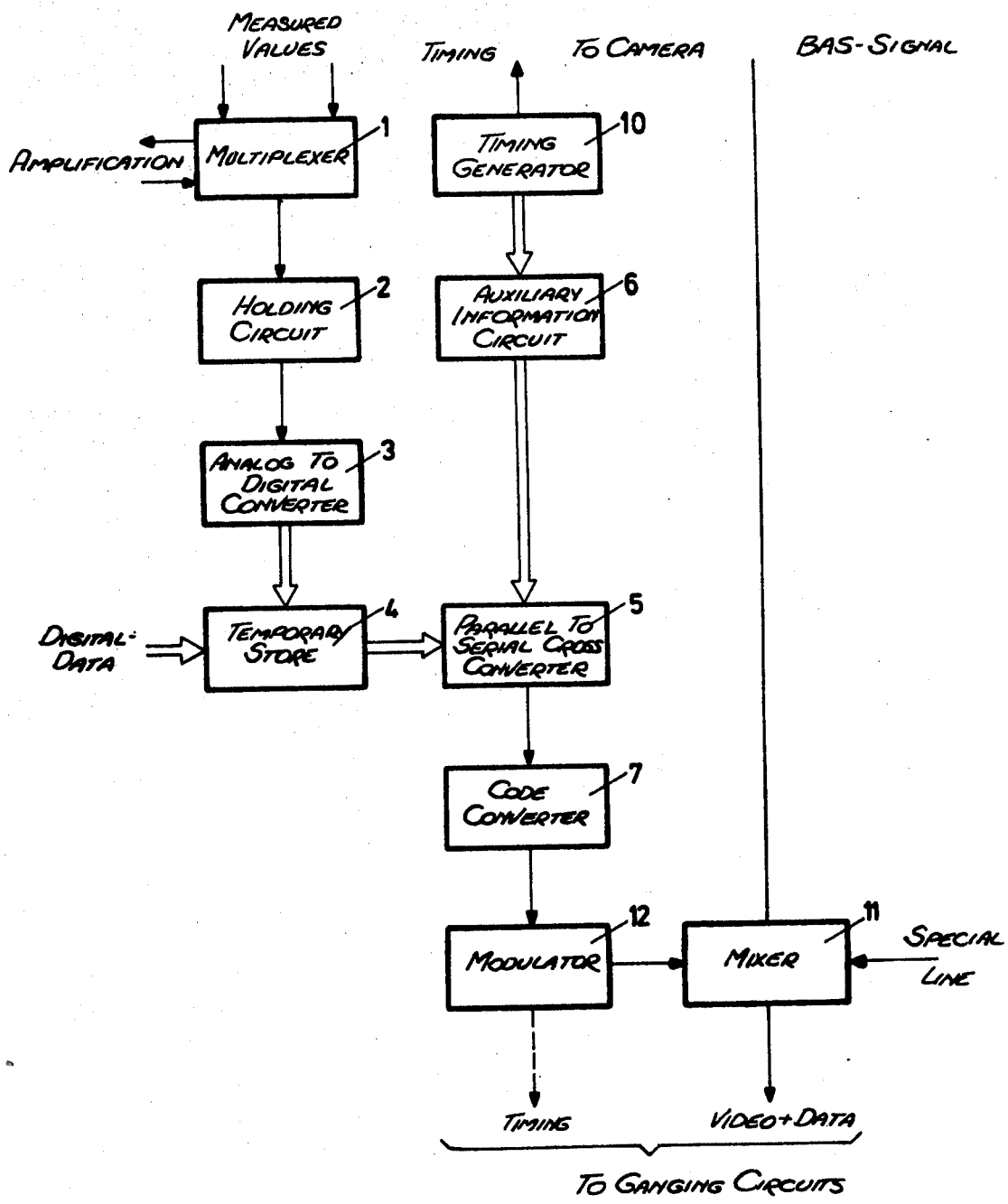
FIG. 4 is a block diagram of a circuit arrangement for recording by the frequency multiplexing method.

FIGS. 3 and 4 show block diagrams of a circuit arrangement for synchronous recording of television pictures and measurement data in accordance with the time multiplexing method and in accordance with the frequency multiplexing method respectively. Commercial apparatus can be employed for the camera and tape recorder.

The camera and the tape recorder must be capable of being externally synchronized. If further processing in a computer at a reduced speed is desired, the tape recorder must allow playback in slow-motion. Apparatus with such capability is readily obtainable for black-and-white and color signals.

In both the time multiplexing method (FIG. 3) and the frequency multiplexing method (FIG. 4), the measurement values are scanned via a multiplexer 1. This may be of modular construction or expanded so that the number of measuring channels can be chosen freely. By suitable design of the control arrangement it is possible to scan several measuring channels in any sequence and at different frequencies.

Where necessary the measured values can be treated before they reach the multiplexer 1 by preamplifiers, filters, individual holding circuits for simultaneous pickup of measured values, etc., which are not shown in the block circuit diagrams of FIGS. 3 and 4.

The output from the multiplexer 1 is delivered to a holding circuit 2 (sample and hold) and thence to an anlogue-digital converter 3.

The speed and resolution of this input portion of the circuit are adapted to the prevailing circumstances of the measurements being made.

The digitalized measured values are transformed from the A/D-converter 3 in parallel to a temporary store 4. Data already available in digital form may also be put into the temporary store 4 directly.

Control of the multiplexer 1, the A/D-converter 3, and the insertion of the signals into the temporary store 4 is effected continuously at a speed which corresponds with the average data rate. Reading out of the data from the temporary store 4 is effected intermittently at a higher speed, namely, recording speed.

The temporary store 4 is so designed that data may be read in at low speed and read out at high speed simultaneously. The continuous read-in speed, the size of store and the intermittent read-out speed are each selected in dependence on the others. Advantageously a first-in-first out store (bucket chain store) is employed as the temporary store.

The data read out in parallel which the temporary store is transformed in a parallel-cross converter 5 into a serial signal. Moreover auxiliary information such as forward run, synchronous words, picture or line number, control bits for the vertical and horizontal synchronization and the amplitude regulation of the television picture, parity bits, wood address, characterisctic number, time code, status information, etc., may be added from an auxiliary information circuit 6.

Subsequently the data may be transformed in a code converter 7 into a code which is particularly suitable for the tape recording. Where the mixing of picture information and other data is effected by the time multiplexing method, direct voltage levels too can be recorded.

This makes it possible to employ besides purely binary codes also ternary or quaternary codes too, by employing not merely two but a greater number of amplitudes.

The circuit components so far described are essentially the same for recording by the time multiplexing and frequency multiplexing methods.

Where the recording is by the time multiplexing method of FIG. 3 the BAA-signal (black-and-white or color) coming from the camera is supplied to a picture limiter 8. In the picture limiter, the horizontal synchronous signal, and if required also the vertical synchronous signal, are separated from the picture information. Furthermore the beginning of the lines and the end of the lines may be cut off. Where pictures are obtained in color, the color carrier is continuously recorded. The picture limiter 8 works on the auxiliary information circuit 6 and on a mixer 9 which obtains the data from the code converter 7.

In addition, special lines may be inserted in the television picture for supervision of picture quality, recording of slow additional information, etc. For both applications known standard input and output units are available. By the introduction of techniques such as teletext or Cefax commercial structural components or apparatus are available by which alphanumeric information may be insertered in such special lines or displayed on television monitors. Other kinds of output units such as printers will follow. Simple and cheap completion of television picture and wide-band measured values by slow information such, e.g., as time, test number, patients name, etc., is thereby made possible.

In the mixer 9 the cut-down picture information and the intermittently recalled data are combined into one signal. Since the camera is synchronized by a timing or clock pulse generator 10 in the circuit arrangement, ganging of picture and data is guaranteed. Since this signal no longer contains any synchronizing information by video standards, the tape recorder is also synchronized during recording by the timing generator 10.

Where the recording is done by the frequency multiplexing method (FIG. 4), the BAS-signal (only back-and-white) coming from the camera is taken directly to a mixer 11. Here, the data coming from the code converter 7 and modulated in a modulator 12 onto an auxiliary carrier is mixed with the picture information. As auxiliary carrier, use is made of the frequency which otherwise contains the chromaticity (4.43361875 MHz in the case of PAL). Special lines may likewise be insertered in the mixer 11.

With this method the camera is again externally timed by a timing generator 10. This timing may be employed for the tape recording.

Figure 5:
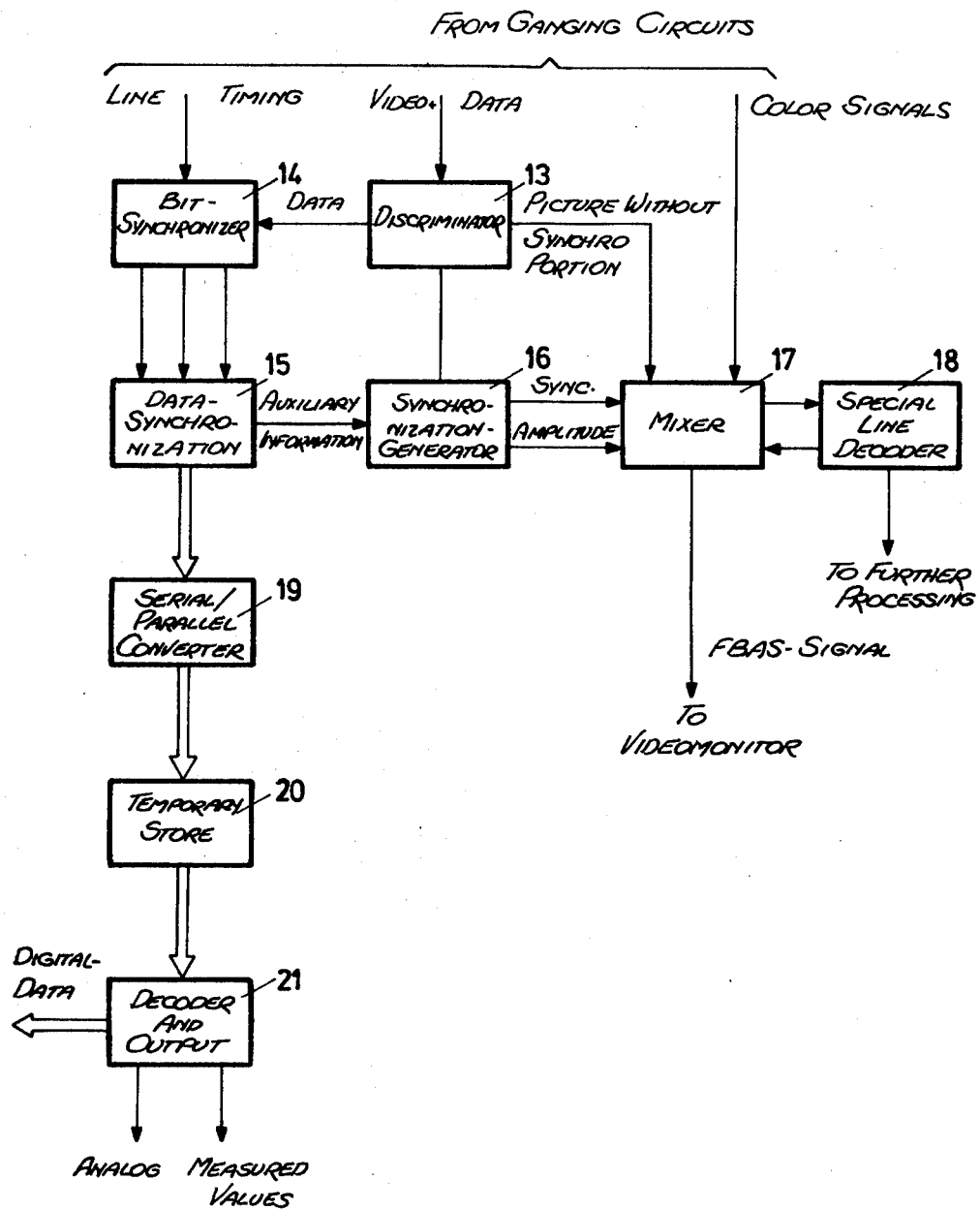
FIG. 5 is a block diagram of a circuit arrangement for playback of signals recorded by the time multiplexing method.
Figure 6:
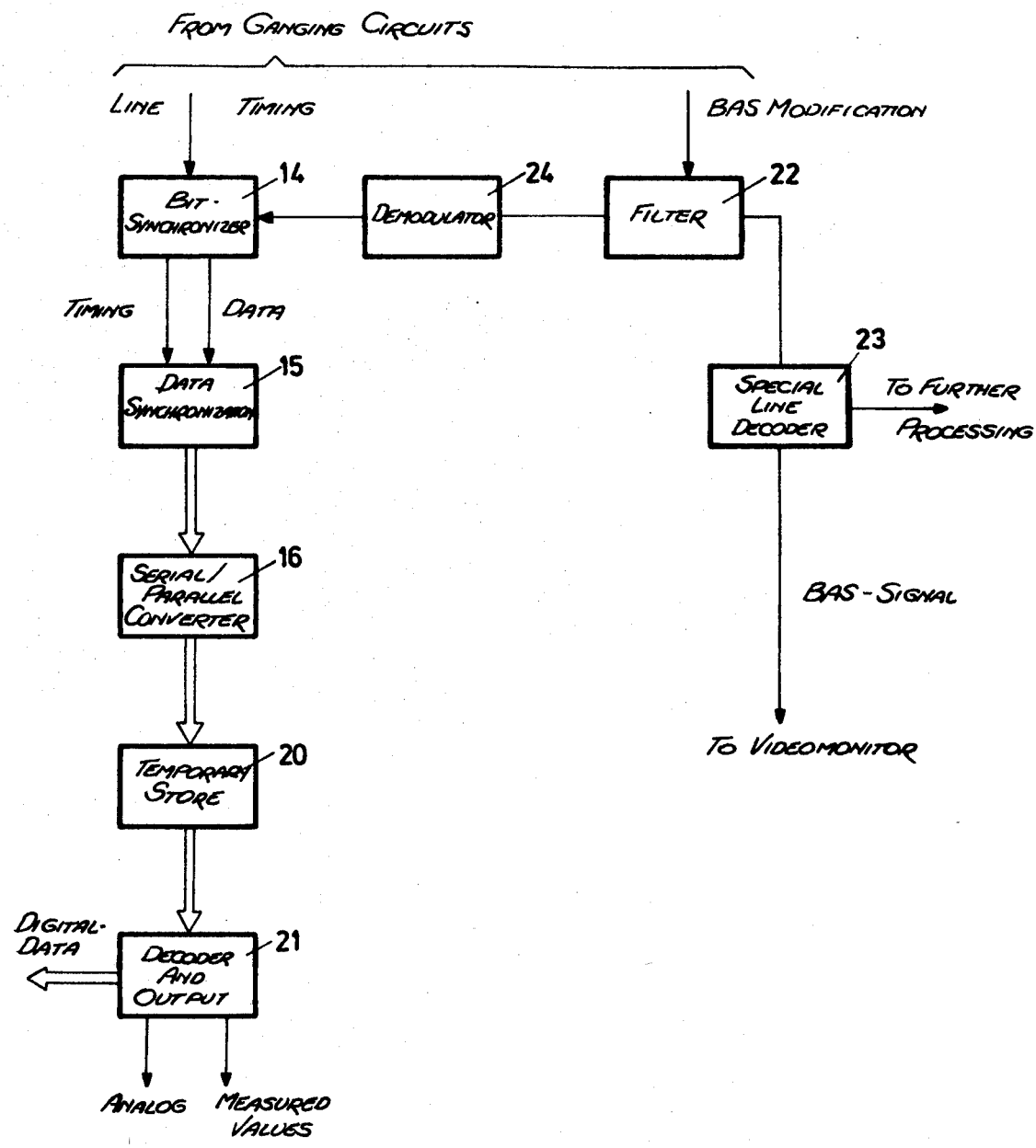
FIG. 6 is a block diagram of a circuit arrangement for playback of signals recorded by the frequency multiplexing method.

In FIGS. 5 and 6, block diagrams are shown of circuit arrangements for playback of television pictures and measuring data recorded synchronously by the time multiplexing method and the frequency multiplexing method respectively. In both circuit arrangements, on playing back the recording from the tape recorder, the picture and data must first of all be separated.

With the time multiplexing method (FIG. 5) the separation is effected in a discriminator 13. The discriminator 12 receives control signals from a bit synchronizer 14 and from a data synchronization circuit 15 via a synchronization generator 16 and chops the signal coming from the tape recorder into the data and picture portions.

In a mixer 17 following the discriminator 13 the missing synchronization signals are attached to the picture signals again. Amplitude regulation is effected on the basis of auxiliary information which is regenerated in the data synchronization circuit 15. At the output from the mixer 17 a normal television signal—FBAS-signal—is thereby made available.

Special lines previously inserted may be decoded by means of a special line decoder 18 connected to the mixer 17. They may be either employed for correction of the television signal, or made available for further processing. Where color is transmitted, the color carrier regenerated from the tape recorder is re-introduced.

In the bit synchronizer 14 the timing of the data portion is recognized and regenerated from the signal coming from the tape recorder. From these signals and the line timing issued by the tape recorder the following control signals are reclaimed in the data synchronization circuit 15:—word timing—start of lines—picture/data boundaries—amplitude control—line number.

The data and some auxiliary information are fed via a serial-parallel converter 19 into a temporary store 20. This transfer is effected intermittently at the recording speed. Read out from the temporary store 20 is effected continuously at the average data rate.

The individual measured values are recognized in a decoder and the output unit 21 and the digital data are issued directly. The output of analogue measured values is effected via digital-analogue converters which are provided additionally.

In the case of the frequency multiplexing method (FIG. 6) the modified BAS-signal from the tape recorder is resolved by a filter 22 into the picture and data portions. The picture signal (black-and-white) thereby becomes available in normal form. Any special lines which have been inserted may be decoded and further processed in a special-line decoder 23 connected between the filter 22 and the video monitor.

The data portion coming from the filter 22 is demodulated in a demodulator 24 and becomes thereby available for further processing in the bit synchronizer 14 and the units 15, 19, 20, 21 which follow. This is effected in the same way as with the time multiplexing method.

Time and frequency multiplexing can also be combined. The data and picture information can then be mixed by time multiplexing and in addition the color carrier mixed in by frequency multiplexing is employed as reference timing. Regeneration of timing and data in the switching arrangement for playback is thereby considerably simplified.

It is evident that the foregoing disclosure will enable those skilled in the art to make numerous other uses and modifications of and departures from the embodiments specifically described herein without departure from the spirit and scope of the present inventive concepts. The present invention is accordingly to be construed as embracing each and every novel feature and novel combination of features herein disclosed and as being limited solely by the scope and spirit of the appended claims.

I claim:

1. Playback apparatus for television picture signals and measured data signals synchronously recorded in time multiplexed form on a record medium, the apparatus comprising playback means for playback of said record medium,
discriminator means connected to said playback means to receive a playback signal therefrom,
first and second outputs to said discriminator means, video-monitor means connected to said first discriminator means output and adapted to display television picture signals received therefrom,
bit-synchronizer means connected to said second discriminator means output to receive data signals therefrom,
data synchronization means connected to said bit-synchronizer means to receive synchronized data signals therefrom,
serial to parallel converter means connected to said data synchronization means and adpated to convert serial signals received therefrom to parallel form,
temporary store means connected to said serial to parallel converter means and adapted to temporarily store signals received therefrom, and
means connected to said temporary store means and adapted to decode signals received therefrom.

2. Apparatus according to claim 1 wherein said temporary store means is a first-in-first-out store means.

3. Apparatus according to claim 1 further including mixer means connected between said discriminator means and said video monitor means and adapted to insert color carrier and auxiliary information signals.

4. Apparatus according to claim 3 further including special line decoder means connected to said mixer means.

5. Playback apparatus for television picture signals and measured data signals synchroniously recorded in frequency multiplexed form on a record medium, the apparatus comprising
playback means for playback of said record medium,
filter means connected to said playback means to receive a playback signal therefrom and adapted to separate said playback signal into television picture signals and data signals
video-monitor means connected to said filter means and adapted to receive and display said television picture signals therefrom,
bit-synchronizer means connected to said filter means to receive said data signals therefrom,
data synchronization means connected to said bit-synchronizer means to receive synchronized data signals therefrom,
serial to parallel converter means connected to said data synchronization means and adapted to convert serial signals received therefrom to parallel form,
temporary store means connected to said serial to parallel converter means and adapted to temporarily store signals received therefrom, and
decoder means connected to said temporary store means and adapted to decode signals received therefrom.

6. Apparatus according to claim 5 further including special line decoder means connected between said filter means and said video monitor means.

7. A method of treating television color picture signals including a color carrier signal and wide-band data signals representing measured data associated with the subject of said television picture signals on a time synchronous basis, comprising the steps of:
receiving said data signals continuously,
converting said received data signals to digital form,
temporarily storing said data signals in digital form,
multiplexing together said digital data signals and television picture signals by at least one of time and frequency multiplexing techniques, and
recording the multiplexed signals on a recording medium in video recorder means,
said measured data being recorded by amplitude modulation of said color carrier signal.

8. A method according to claim 7, wherein said wide-band data signals are of a frequency of more than 100 KHz.

9. A method according to claim 7 wherein said video recorder means are color video recorder means and wherein said data signals are recorded on the chrominance signals channel.

10. A method according to claim 7 further including the step of playing back said recorded signals with the rate of feed of a magnetic tape reduced relative to the recording speed, the speed of a video head carrier being unaltered.

11. A method according to claim 7 further including the step of displaying said data with said television picture on an amplitude vs time basis.

12. Apparatus for synchronously recording television picture signals and measured wide-band data signals comprising
multiplexer means,
means supplying wide band measured data signals to said multiplexer means,
signal holding means connected to said multiplexer means and adapted to receive and hold data signals therefrom,
analogue to digital converter means connected to said signal holding means and adapted to convert signals received therefrom into digital form,
store means connected to said analogue to digital converter means and adapted to store digital data signals received therefrom,
a source of television picture signals,
mixer means connected to said store means and to said source and adapted to multiplex together digital data signals and television signals received respectively therefrom,
video-recorder means connected to said mixer means and adapted to record multiplexed signals received therefrom on a record medium therein and, parallel to serial converter means connected between said store means and said mixer means and adapted to convert parallel signals received from said store means to serial form for transmission to said mixer means.

13. A method according to claim 12 wherein said wide-band data signals are of a frequency of more than 100 KHz.

14. Apparatus according to claim 12 further including timing generator means connected to said source of television picture signals and to said parallel to serial converter means.

15. Apparatus according to claim 12 further includes code converter means connected between said parallel to serial converter means and said mixer means.

16. Apparatus according to claim 12 further including an auxiliary information circuit connected to said parallel to serial converter means.

17. Apparatus according to claim 12 further including modulator means connected between said parallel to serial converter means and said mixer means.

* * * * *